(12) United States Patent  (10) Patent No.: US 11,967,485 B2
Kamata et al.  (45) Date of Patent: Apr. 23, 2024

(54) PLASMA PROCESSING APPARATUS AND PLASMA PROCESSING METHOD

(71) Applicant: Tokyo Electron Limited, Tokyo (JP)

(72) Inventors: Eiki Kamata, Nirasaki (JP); Taro Ikeda, Nirasaki (JP); Mikio Sato, Nirasaki (JP); Nobuhiko Yamamoto, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 279 days.

(21) Appl. No.: 17/083,709

(22) Filed: Oct. 29, 2020

(65) Prior Publication Data
US 2021/0134560 A1 May 6, 2021

(30) Foreign Application Priority Data
Nov. 5, 2019 (JP) ................. 2019-200801

(51) Int. Cl.
H01J 37/32 (2006.01)
H05H 1/46 (2006.01)

(52) U.S. Cl.
CPC .... *H01J 37/3222* (2013.01); *H01J 37/32238* (2013.01); *H05H 1/46* (2013.01)

(58) Field of Classification Search
CPC ............. H01J 37/3222; H01J 37/32238; H01J 37/32339; H05H 1/46; H01Q 1/362
See application file for complete search history.

(56) References Cited

U.S. PATENT DOCUMENTS 4,148,030 A * 4/1979 Foldes ................... H01Q 11/08
343/895

2011/0215984 A1 * 9/2011 Coburn ................... H01Q 1/362
343/895

FOREIGN PATENT DOCUMENTS

| CN | 209843939 U | * | 12/2019 | |
|---|---|---|---|---|
| JP | 9-199295 A | | 7/1997 | |
| JP | 2006-278642 A | | 10/2006 | |
| JP | 2006278642 A | * | 10/2006 | |
| JP | 2008076239 A | * | 4/2008 | |
| JP | 2010-170974 A | | 8/2010 | |
| JP | 2017-103454 A | | 6/2017 | |
| JP | 2018-181634 A | | 11/2018 | |
| KR | 20030064717 A | * | 12/2019 | ............. H01Q 1/243 |

OTHER PUBLICATIONS

Kraus, John D., "Antennas 2nd Edition" (1988), McGraw-Hill, New York.

* cited by examiner

*Primary Examiner* — Abdullah A Riyami
*Assistant Examiner* — Syed M Kaiser
(74) *Attorney, Agent, or Firm* — Nath, Goldberg & Meyer; Jerald L. Meyer; Tanya E. Harkins

(57) ABSTRACT

There is provided a plasma processing apparatus including: a chamber having a processing space in which a plasma processing is performed on a substrate and a synthetic space in which electromagnetic waves are synthesized; a dielectric window configured to partition the processing space and the synthetic space; an antenna unit including a plurality of antennas configured to radiate the electromagnetic waves to the synthetic space; an electromagnetic wave output part configured to output the electromagnetic waves to the antenna unit; and a controller configured to control the antenna unit to function as the phased array antenna, wherein the plurality of antennas are helical antennas.

17 Claims, 9 Drawing Sheets

Electromagnetic wave $\delta(x) = k((x^2 + z^2)^{1/2} - z)$

PLASMA PROCESSING APPARATUS AND PLASMA PROCESSING METHOD

CROSS-REFERENCE TO RELATED APPLICATION

This application is based upon and claims the benefit of priority from Japanese Patent Application No. 2019-200801, filed on Nov. 5, 2019, the entire contents of which are incorporated herein by reference.

TECHNICAL FIELD

The present disclosure relates to a plasma processing apparatus and a plasma processing method.

BACKGROUND

A plasma processing apparatus is known that forms a gas into plasma by the power of electromagnetic waves and performs plasma processing on a substrate such as a semiconductor wafer inside a chamber. For example, Patent Document 1 discloses a plasma processing apparatus including a dielectric member that constitutes a ceiling wall of a chamber, a microwave output part that outputs microwaves (electromagnetic waves), and a plurality of microwave radiation mechanisms arranged on the dielectric member. In the plasma processing apparatus disclosed in Patent Document 1, the microwaves output from the microwave output part are radiated into the chamber from antennas of the plurality of microwave radiation parts via the dielectric member to form plasma inside the chamber and perform plasma processing on a substrate.

PRIOR ART DOCUMENT

Patent Document

Patent Document 1: Japanese Laid-Open Patent Publication No. 2018-181634

SUMMARY

According to one embodiment of the present disclosure, a plasma processing apparatus includes: a chamber having a processing space in which a plasma processing is performed on a substrate and a synthetic space in which electromagnetic waves are synthesized; a dielectric window configured to partition the processing space and the synthetic space; an antenna unit including a plurality of antennas configured to radiate the electromagnetic waves to the synthetic space and configured to function as a phased array antenna; an electromagnetic wave output part configured to output the electromagnetic waves to the antenna unit; and a controller configured to control the antenna unit to function as the phased array antenna, wherein the plurality of antennas are helical antennas.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Configuration of Plasma Processing System>

Figure 1:
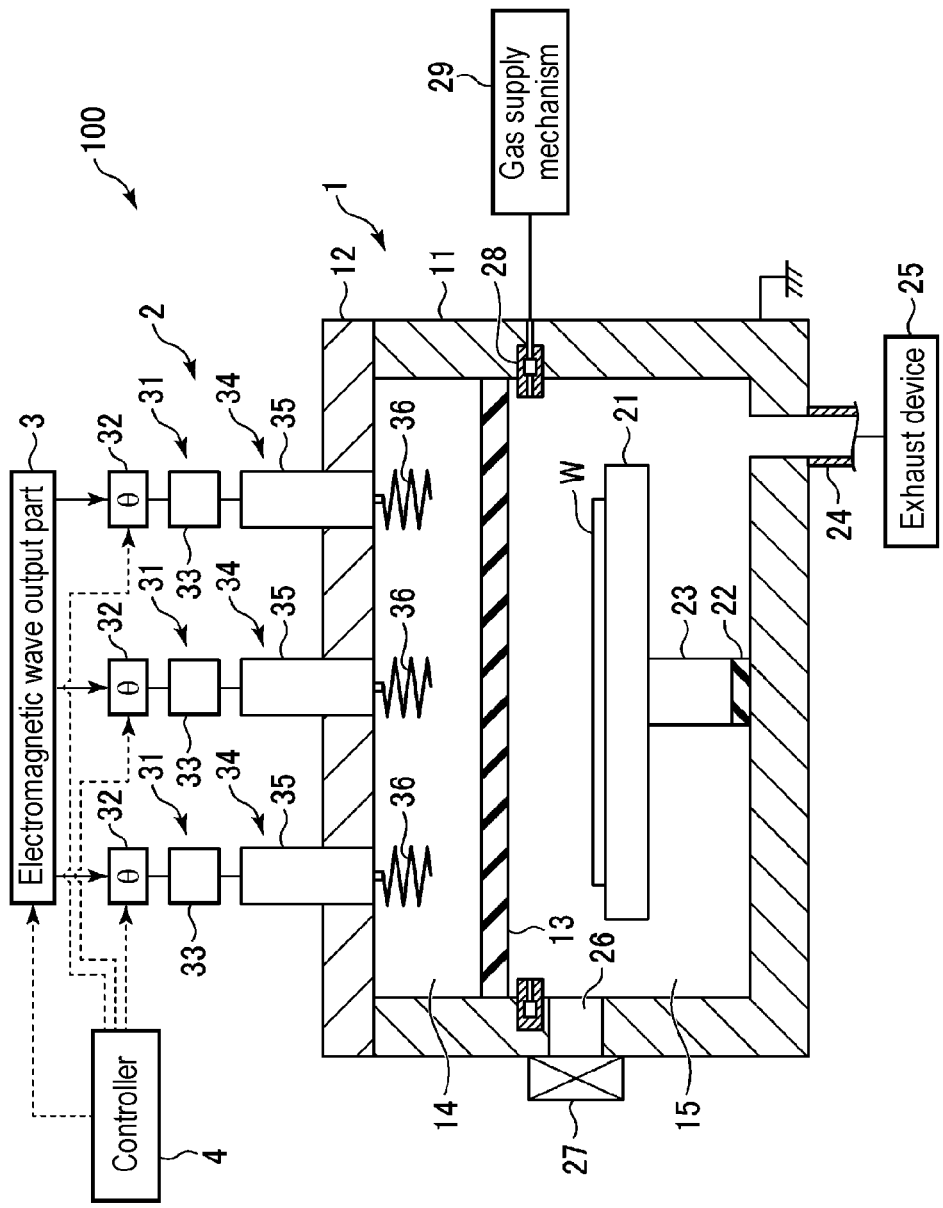
FIG. 1 is a cross-sectional view showing a plasma processing apparatus according to an embodiment.

FIG. 1 is a cross-sectional view showing a plasma processing apparatus according to an embodiment. A plasma processing apparatus 100 of the present embodiment forms surface wave plasma by electromagnetic waves (microwaves), and performs a plasma process such as a film forming process, an etching process, or the like on a substrate W by the formed surface wave plasma. A typical example of the substrate W may include a semiconductor wafer, but the substrate W is not limited thereto and may be another substrate such as an FPD substrate, a ceramic substrate, or the like.

The plasma processing apparatus 100 has a chamber 1, an antenna unit 2, an electromagnetic wave output part 3, and a controller 4.

The chamber 1 has a container part 11 having a substantially cylindrical shape with its upper portion opened, and a ceiling plate 12 that closes the upper opening of the container part 11. The chamber 1 is made of a metallic material such as aluminum, stainless steel, or the like.

An internal space of the chamber 1 is vertically partitioned by a dielectric window 13 into a space above the dielectric window 13, which is a synthetic space 14 where electromagnetic waves are synthesized, and a space below the dielectric window 13, which is a processing space 15 where plasma processing is performed on the substrate W. The dielectric window 13 is made of, for example, quartz, ceramics such as alumina ($Al_2O_3$) or the like, a fluorine-based resin such as polytetrafluoroethylene or the like, or a polyimide-based resin. The synthetic space 14 is an atmospheric space. The electromagnetic waves are radiated from a plurality of antennas (to be described later) of the antenna unit 2 into the synthetic space 14, and are synthesized inside the synthetic space 14. Further, the processing space 15 is provided with a disc-shaped stage 21 on which the substrate W is placed horizontally. Surface wave plasma for processing the substrate W is formed inside the processing space 15. The processing space 15 is in a vacuum state during plasma processing.

The stage 21 is supported by a cylindrical support member 23 that is provided upright via an insulating member 22. An example of a material constituting the stage 21 includes metal such as aluminum whose surface is anodized, or a dielectric member such as ceramics. The stage 21 may be provided with an electrostatic chuck for electrostatically attracting the substrate W, a temperature control mechanism, a gas flow path for supplying a gas for heat transfer to a back surface of the substrate W therethrough, and the like.

Depending on the plasma processing, a high frequency bias power supply may be electrically connected to the stage 21 via a matching device. By supplying high frequency power to the stage 21 from the high frequency bias power supply, ions in the plasma are drawn toward the substrate W.

An exhaust pipe 24 is connected to the bottom of the chamber 1. An exhaust device 25 including a pressure control valve and a vacuum pump is connected to the exhaust pipe 24. When the exhaust device 25 is operated, the interior of the processing space 15 of the chamber 1 is exhausted to be depressurized to a predetermined degree of vacuum. A loading/unloading port 26 for loading/unloading the substrate W therethrough and a gate valve 27 for opening/closing the loading/unloading port 26 are provided in a sidewall of the chamber 1.

A ring-shaped gas flow path is formed inside the sidewall of the chamber 1 below the dielectric window 13. A shower ring 28 having a plurality of gas discharge holes that are opened inward of the gas flow path is provided. A gas supply mechanism 29 is connected to the shower ring 28. A noble gas such as an Ar gas used as a plasma generation gas and a processing gas for the plasma processing are supplied from the gas supply mechanism 29.

The antenna unit 2 radiates the electromagnetic waves output from the electromagnetic wave output part 3 to the synthetic space 14 in the chamber 1 from above the chamber 1, and has a plurality of antenna modules 31. Each of the antenna modules 31 includes a phase shifter 32, an amplifier part 33, and an electromagnetic wave radiation part 34. The electromagnetic wave radiation part 34 includes a transmission line 35 that transmits an electromagnetic wave amplified by the amplifier part 33, and an antenna 36 that extends from the transmission line 35 and radiates the electromagnetic wave to the synthetic space 14. The antenna 36 is a helical antenna. The phase shifter 32 and the amplifier part 33 of the antenna module 31 are provided above the chamber 1.

The phase shifter 32 changes a phase of an electromagnetic wave and is configured to adjust the phase by advancing or delaying the phase of the electromagnetic wave radiated from the antenna 36. By adjusting the phase of the electromagnetic wave with the phase shifter 32, it is possible to focus the electromagnetic waves at a desired position on the dielectric window 13 by using interference of the electromagnetic waves.

The amplifier part 33 has a variable gain amplifier, a main amplifier that constitutes a solid state amplifier, and an isolator. The variable gain amplifier is an amplifier for adjusting a power level of an electromagnetic wave to be input to the main amplifier and adjusting the variation of the individual antenna modules 31 or the electromagnetic wave intensity. The main amplifier can be configured to include, for example, an input matching circuit, a semiconductor amplification element, an output matching circuit, and a high Q resonance circuit. The isolator separates a reflected electromagnetic wave which is reflected off the antenna 36 and is oriented toward the main amplifier.

The transmission line 35 of the electromagnetic wave radiation part 34 is fitted into the ceiling plate 12. A lower end of the transmission line 35 is flush with an inner wall of the ceiling plate. The antenna 36 extends from the lower end of the transmission line 35 into the synthetic space 14 so that an axis of the antenna 36 is vertical. That is, the antenna 36 extends from an inner surface of an upper wall of the synthetic space 14 into the synthetic space 14. As the antenna 36, copper, brass, silver-plated aluminum, or the like may be used. Details of the helical antenna constituting the antenna 36 will be described later.

Figure 2:
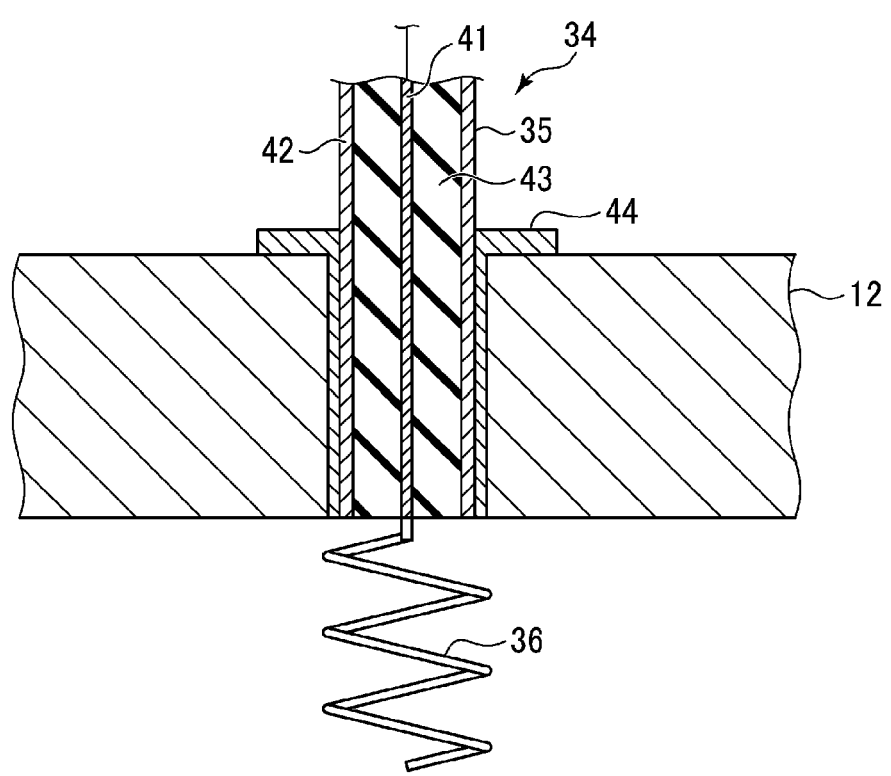
FIG. 2 is a cross-sectional view showing a detailed configuration of an electromagnetic wave radiation part.

As shown in FIG. 2, the transmission line 35 includes an inner conductor 41 disposed at the center, an outer conductor 42 disposed around the inner conductor 41, and a dielectric member 43 such as Teflon® interposed between the inner conductor 41 and the outer conductor 42, and has the form of a coaxial cable. Reference numeral 44 is a sleeve. The antenna 36 is connected to the inner conductor 41.

Figure 3:
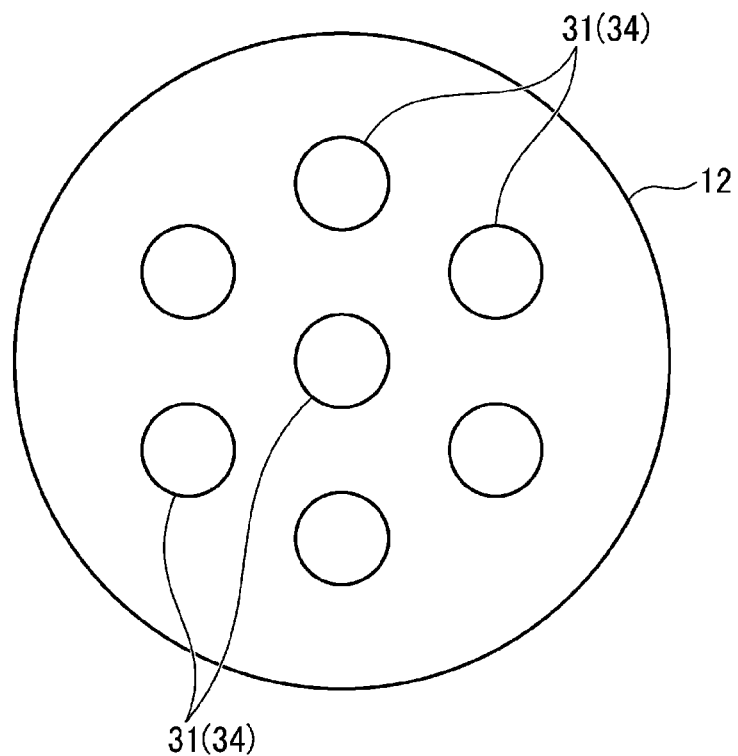
FIG. 3 is a view schematically showing an arrangement of antenna modules in the plasma processing apparatus of FIG. 1.

The plurality of antenna modules 31 (the electromagnetic wave radiation part 34) are evenly provided on the ceiling plate 12. The number of antenna modules 31 may be set to an appropriate number so that appropriate plasma is formed. In this example, as shown in FIG. 3, seven antenna modules 31 (the electromagnetic wave radiation part 34) are provided (only three are shown in FIG. 1).

By adjusting the phase of the electromagnetic wave radiated from the antenna 36 by the phase shifter 32 of each antenna module 31, it is possible to cause interference of the electromagnetic waves and focus the electromagnetic waves on an arbitrary portion of the dielectric window 13. That is, the antenna unit 2 functions as a phased array antenna.

Figure 4:
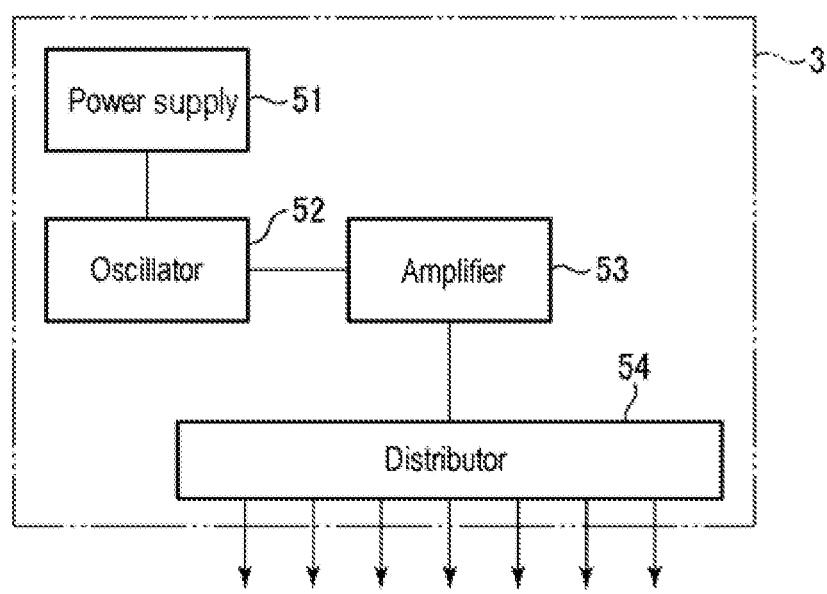
FIG. 4 is a block diagram showing a configuration of an electromagnetic wave output part in the plasma processing apparatus of FIG. 1.

As shown in FIG. 4, the electromagnetic wave output part 3 includes a power supply 51, an oscillator 52, an amplifier 53 that amplifies an oscillated electromagnetic wave, and a distributor 54 that distributes the amplified electromagnetic wave to each antenna module 31, and outputs the electromagnetic wave to each antenna module 31.

The oscillator 52 oscillates the electromagnetic wave by, for example, a phase-locked loop (PLL) manner. As the electromagnetic wave, for example, one having a frequency of 860 MHz is used. As the frequency of the electromagnetic wave, a desired frequency in a range of 500 MHz to 3 GHz may be used in addition to 860 MHz. The distributor 54 distributes the electromagnetic wave amplified by the amplifier 53.

The controller 4 has a CPU, and controls each component of the plasma processing apparatus 100. The controller 4 includes a storage part that stores control parameters and processing recipes of the plasma processing apparatus 100, an input part, a display, and the like. The controller 4 controls power of the electromagnetic wave output part 3, the supply of a gas from the gas supply mechanism 29, and the like. In addition, the controller 4 outputs a control signal to the phase shifter 32 of each antenna module 31 to control the phase of the electromagnetic wave radiated from the electromagnetic wave radiation part 34 (the antenna 36) of each antenna module 31, thereby causing interference in the electromagnetic waves so that the electromagnetic waves are focused on a desired portion of the dielectric window 13. That is, the controller 4 controls the antenna unit 2 to function as a phased array antenna.

The control of the phase shifter 32 by the controller 4 may be performed by, for example, storing in advance a plurality of tables indicating a relationship between the phase of each antenna module and the focusing position of electromagnetic waves in the storage part, and switching the tables at a high speed.

The antenna unit 2, the electromagnetic wave output part 3, and the controller 4 constitute a plasma source that generates plasma for plasma processing.

[Helical Antenna]

Figure 5:
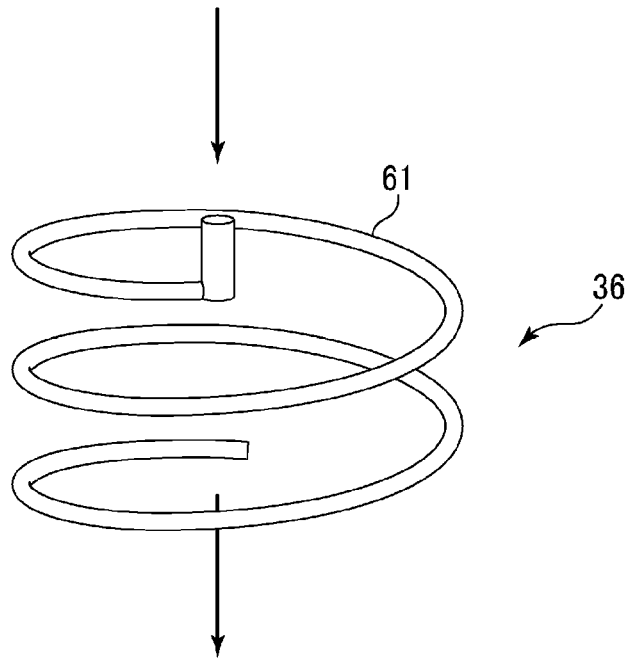
FIG. 5 is a perspective view showing a helical antenna constituting an antenna.

Next, the helical antenna constituting the antenna 36 will be described. As shown in a perspective view of FIG. 5, the helical antenna constituting the antenna 36 is an antenna in which a metal wire 61 is spirally wound, and has a high directivity in the axial direction of a spiral within a specific range of dimensions. Therefore, a radiation component of the electromagnetic wave radiated from the antenna 36 is mainly in the downward direction, and the radiation component thereof in the lateral direction is small, so that mutual coupling between the antennas is small and reflection on a wall is also small.

Further, by optimizing the shape and arrangement of the helical antenna that constitutes the antenna 36, the electromagnetic wave interference can be more easily generated, and the controllability of an electric field distribution control can be improved.

Figure 6:
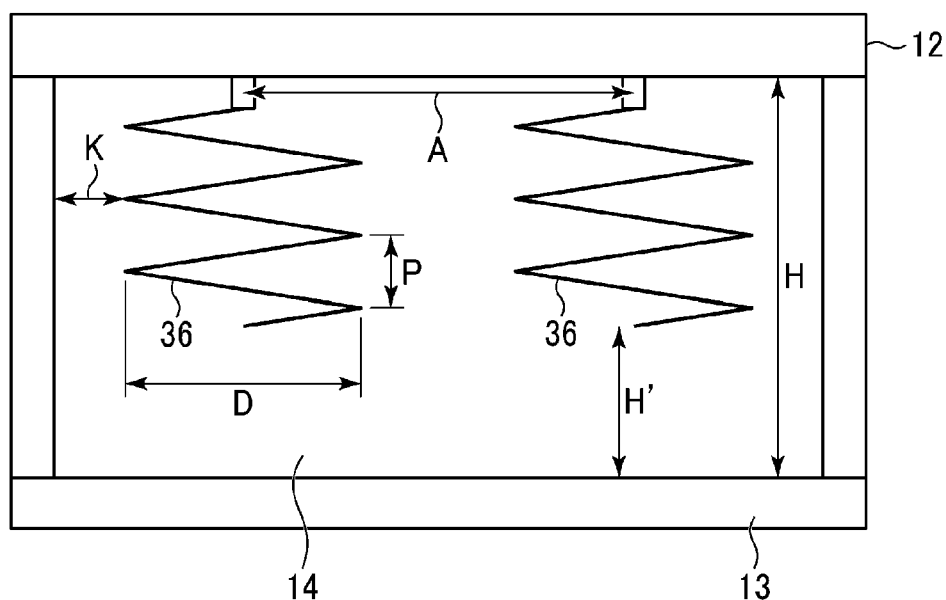
FIG. 6 is a view for explaining parameters related to a helical antenna disposed in a synthetic space.

FIG. 6 is a view for explaining parameters related to the helical antenna disposed in the synthetic space 14. For the sake of convenience in illustration, a state in which two helical antennas are disposed is shown in FIG. 6. In FIG. 6, D is the diameter of the helical antenna, P is the pitch of the helical antenna, A is the distance between the antennas, H is the height of the synthetic space 14, H' is the height from the lower end of the helical antenna to the dielectric window 13, and K is the distance from the antenna to the sidewall of the synthetic space 14. Further, in FIG. 6, the number of turns N of the helical antenna is illustrated as 3.

The helical antenna is designed to have X in one turn, where X is the wavelength of the electromagnetic wave, and the diameter D is X/n. However, the diameter D may be adjusted in a range of 10 to 20% for fine adjustment. The distance A between the antennas is a distance suitable for causing interference of the electromagnetic waves, and needs to be a distance that does not physically interfere with each other. The distance preferably satisfies the relationship $A \leq \lambda/2$.

A typical shape of a helical antenna is disclosed in "Antennas 2nd edition (1988)" by John D. Kraus. On page 284 of this document, the number of turns N of the general helical antenna is disclosed as N>3, and the helical angle α of the helical antenna is disclosed as 12°<α<14°. Calculating the pitch P from a, a condition of $\lambda/5 < P < \lambda/4$ is obtained. This condition is a range in which the width of an electromagnetic beam is reduced and the radiation characteristic (straightness) is improved.

However, in the present embodiment, since it is necessary that the electromagnetic waves radiated from the plurality of antennas 36 interfere with each other, it is preferable that the electromagnetic wave interference is more likely to occur below the antennas 36 rather than the radiation characteristics. From such a viewpoint, as the number of turns N and the pitch P, unlike those of the general helical antenna, the number of turns N is selected in a range of 1 to 3 and the pitch P is selected in a range of $\lambda/12$ to $\lambda/8$ (particularly about $\lambda/10$).

In addition, the synthetic space 14 in which the electromagnetic waves are synthesized is a closed space whose upper wall and side wall are surrounded by metal. If the height H of the synthetic space 14 is too high, multiple reflection of the electromagnetic waves causes a waveguide mode, which may make it difficult to control the electric field distribution. The waveguide mode includes various patterns such as TM01, TE01, and the like, and one of the patterns appears depending on the conditions. Further, if the height H is too low, the electromagnetic wave interference is less likely to occur. Therefore, the height H of the synthetic space 14 is preferably in a range of $\lambda/4$ to $\lambda/2$. Even if the height H of the synthetic space 14 satisfies the above range, multiple reflections occur when the height H' from the lower end of the helical antenna to the dielectric window 13 is too high, and the electromagnetic wave interference becomes difficult to occur when the height H' is too low. Therefore, it is more important to define the height H'. From such a point, the height H' from the lower end of the helical antenna to the surface of the dielectric window 13 is preferably in a range of $\lambda/8$ to $\lambda/2$. Further, as described above, since the helical antenna has high directivity in the axial direction, it is difficult for reflection to occur on the sidewall of the synthetic space 14, but the influence of the reflection on the sidewall of the synthetic space 14 occurs if the distance K between the antenna and the sidewall is smaller than $\lambda/10$. Therefore, K is preferably $\lambda/10$ or more.

When the wavelength of the electromagnetic wave is 860 MHz, k is 348.6 mm, so the preferred range of each parameter is as follows:

Diameter D: 88.8 to 133.2 mm (value obtained by ($\lambda/\pi$) ±20%)

Distance A: 174.3 mm or less

Pitch P: 29.1 to 43.6 mm (especially about 34.9 mm)

Height H: 87.2 to 174.3 mm

Height H': 43.6 to 174.3 mm

Distance K: 34.9 mm

<Operation of Plasma Processing Apparatus>

Next, the operation of the plasma processing apparatus 100 configured as above will be described. The following operation is performed under the control of the controller 4.

First, the gate valve 27 is opened, and the substrate W is loaded into the processing space 15 of the chamber 1 which is in the evacuation state, from a vacuum transfer chamber (not shown) provided adjacent to the chamber 1 by a transfer device (not shown) via the loading/unloading port 26, and is placed on the stage 21.

After the gate valve 27 is closed, the processing space 15 is adjusted to a predetermined vacuum pressure by the exhaust device 25, and electromagnetic waves are output from the electromagnetic wave output part 3 while a gas for plasma processing is being introduced into the processing space 15 from the gas supply mechanism 29. The electromagnetic waves output from the electromagnetic wave output part 3 are supplied to the plurality of antenna modules 31 of the antenna unit 2 and are radiated to the synthetic space 14 of the chamber 1 from the electromagnetic wave radiation parts 34 of the plurality of antenna modules 31

Figure 7:
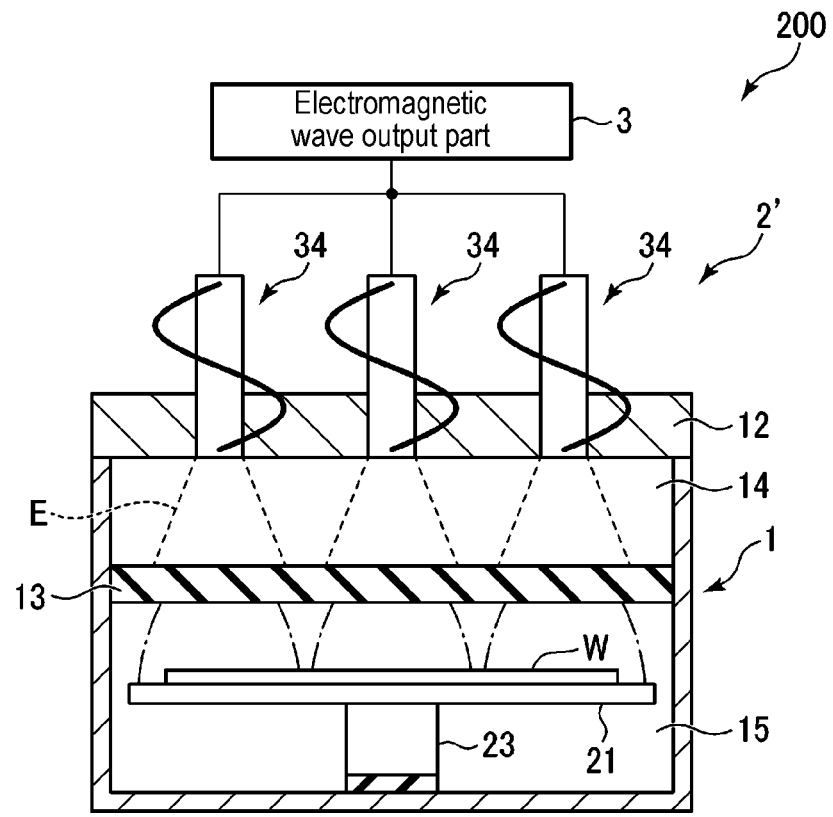
FIG. 7 is a cross-sectional view for explaining a processing state of a plasma processing apparatus that has a plurality of electromagnetic wave radiation parts and does not perform phase control.
Figure 7:
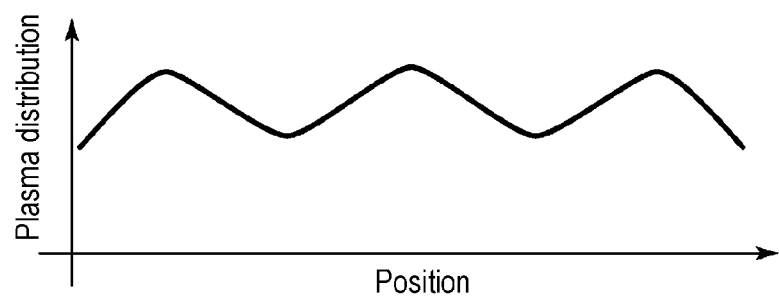

At this time, similarly to the conventional plasma processing apparatus having a plurality of electromagnetic wave radiation parts, in a plasma processing apparatus 200 of FIG. 7 that does not perform phase control, phases of electromagnetic waves E radiated from a plurality of electromagnetic wave radiation parts 34 (the antennas 36) of an antenna unit 2' are the same. For this reason, as shown in FIG. 7, since the electromagnetic waves E do not interfere with each other, electric field strengths of portions corresponding to the electromagnetic wave radiation parts 34 are high and electric field strengths of portions between the electromagnetic wave radiation parts 34 are low. That is, the distribution of the electric field strengths depends on the physical arrangement of the electromagnetic wave radiation parts 34. Thus, the plasma distribution also becomes non-uniform with strong and weak portions depending on the physical arrangement of the electromagnetic wave radiation parts 34.

Figure 8:
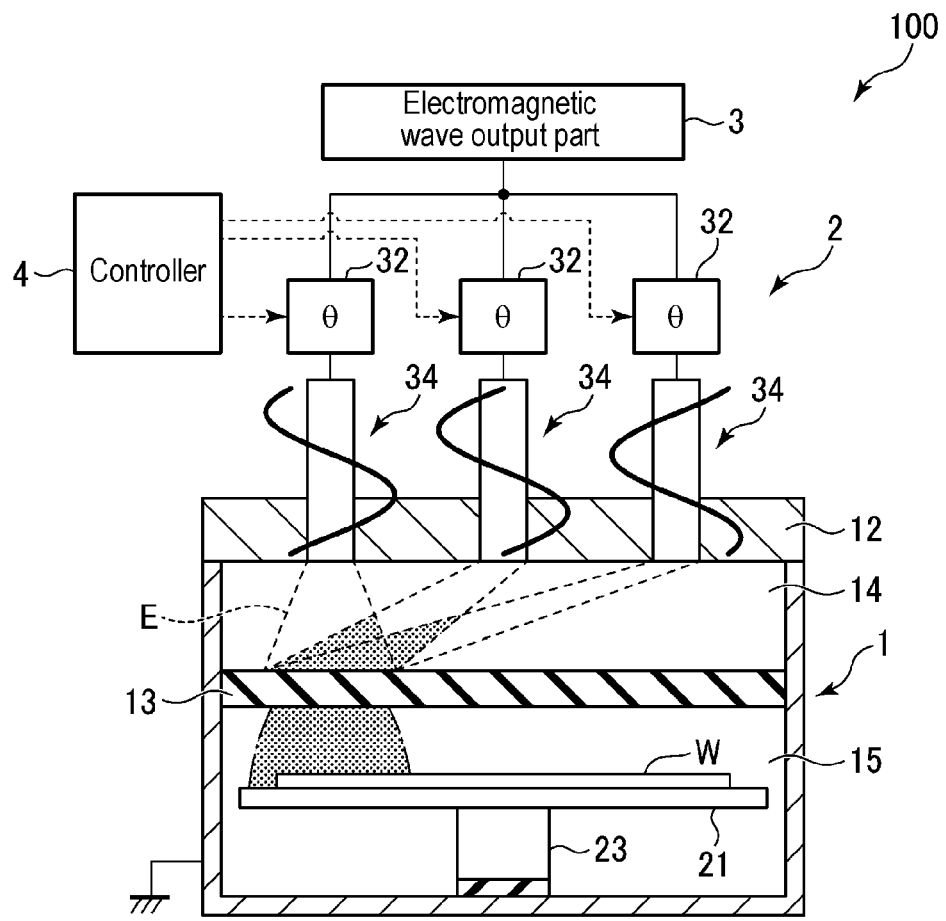
FIG. 8 is a cross-sectional view for explaining a processing state of the plasma processing apparatus according to an embodiment.
Figure 8:
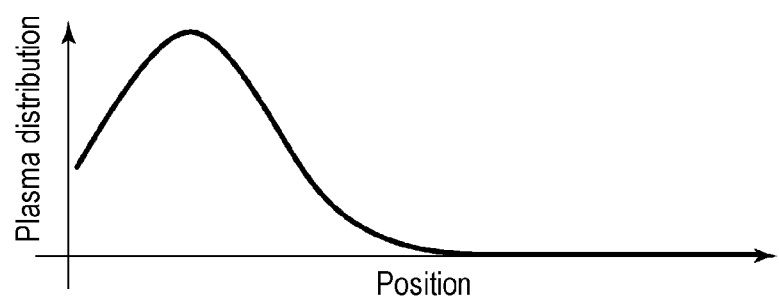

In contrast, in the present embodiment, as shown in FIG. 8, by outputting a control signal from the controller 4 to the phase shifter 32, the phase of the electromagnetic wave E radiated from the electromagnetic wave radiation part 34 (the antenna 36) of each antenna module 31 is controlled. That is, the antenna unit 2 functions as a phased array antenna. Thus, when the electromagnetic waves E are synthesized in the synthetic space 14, interference of the electromagnetic waves occurs so that a portion where the electromagnetic waves E are focused, that is, a portion having high electromagnetic wave strength, can be formed at a desired portion of the dielectric window 13, which makes it possible to locally increase the electric field strength at that portion. Further, by controlling the phase of the electromagnetic wave E radiated from the electromagnetic wave radiation part 34, the focusing portion of the electromagnetic wave can be moved at high speed.

The electromagnetic waves focused on the dielectric window 13 transmit through the dielectric window 13. The electric field of the electromagnetic waves causes a gas to be turned into plasma so that plasma is intensively generated at a position immediately below the focusing portion in the processing space 15. Then, by moving the focusing portion at a high speed by the phase control, it is possible to freely control the plasma distribution regardless of the physical arrangement of the electromagnetic wave radiation parts 34.

[Details of Phase Control]

Next, details of the electromagnetic wave phase control when the antenna unit 2 functions as a phase array antenna will be described with reference to FIGS. 9 to 11.

Figure 9:
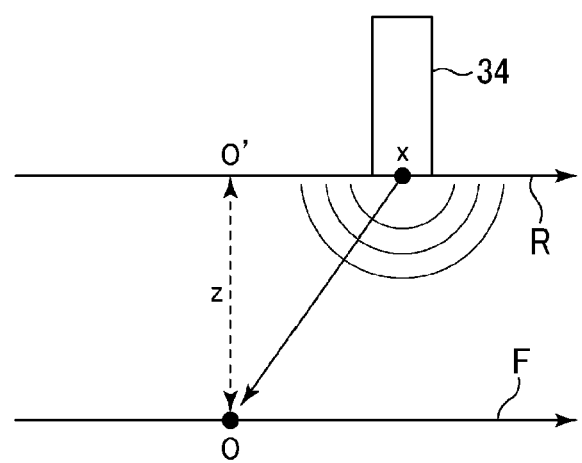
FIG. 9 is a schematic view for explaining a principle of focusing electromagnetic waves in the plasma processing apparatus according to the embodiment.

FIG. 9 is a schematic view for explaining the focusing principle in the plasma processing apparatus 100 according to an embodiment. It is assumed that a back surface of the ceiling plate 12 where the position of the electromagnetic wave radiated from the electromagnetic wave radiation part 34 exists is a radiation surface R, a front surface of the dielectric window 13 irradiated with the electromagnetic wave is an irradiation surface F, and a distance between the radiation surface R and the irradiation surface F is z. It is also assumed that a position on the irradiation surface F where the electromagnetic wave is to be focused is O, and a position on the radiation surface R corresponding to the position O is O'. At this time, the phase of the electromagnetic wave radiated from the electromagnetic wave radiation part 34 which is separated from the position O' by x, is considered. A distance between the position O where the electromagnetic wave is to be focused and the position O' is z, and a distance between the position O and the position x of the electromagnetic wave radiated from the electromagnetic wave radiation part 34 is $(x^2+z^2)^{1/2}$. Letting the wave number of the electromagnetic wave be k ($=2\pi/\lambda$ (where $\lambda$ is the wavelength of the electromagnetic wave)) and the phase at the position O of the electromagnetic wave radiated from the position x (that is, a phase difference of the phase at the position O of the electromagnetic wave radiated from the position x with respect to the phase at the position O of the electromagnetic wave radiated from the position O') be $\delta(x)$, the following expression (1) is established.

$$k(x^2+z^2)^{1/2}-\delta(x)=kz \qquad (1)$$

By transforming the equation (1), the following equation (2) for the phase $\delta(x)$ is obtained.

$$\delta(x)=k\{(x^2+z^2)^{1/2}-z\} \qquad (2)$$

Figure 10:
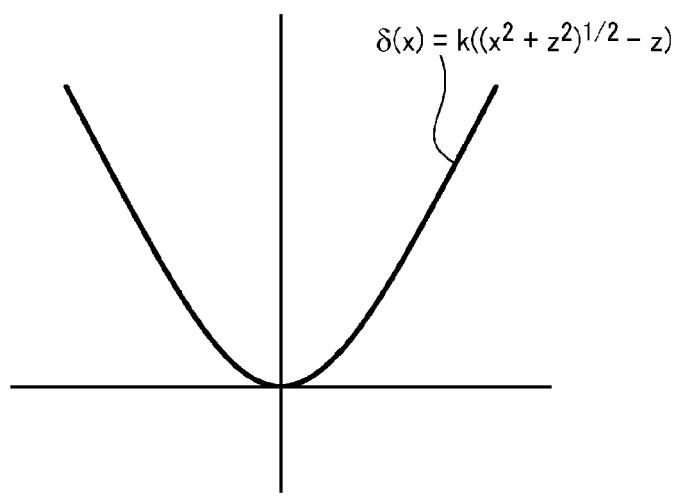
FIG. 10 is a view in which a phase $\delta(x)$ at a position O of an electromagnetic wave radiated from an electromagnetic wave radiation position x is plotted in coordinates.

When $\delta(x)$ is expressed as a function of x on the coordinates, a curve shown in FIG. 10 is obtained.

The phase $\delta(x)$ can be understood as a deviation in the traveling direction between the electromagnetic wave from the position O' to the position O and the electromagnetic wave from the position x to the position O, and becomes larger as the position of the electromagnetic wave radiated from the electromagnetic wave radiation part 34 is farther from the position O' (that is, x become larger). Therefore, by advancing or delaying the phase θ of the electromagnetic wave radiated from the electromagnetic wave radiation part 34 in accordance with the value of the phase $\delta(x)$, the electromagnetic waves radiated from the plurality of electromagnetic wave radiation parts 34 can be strengthened at the position O.

Figure 11:
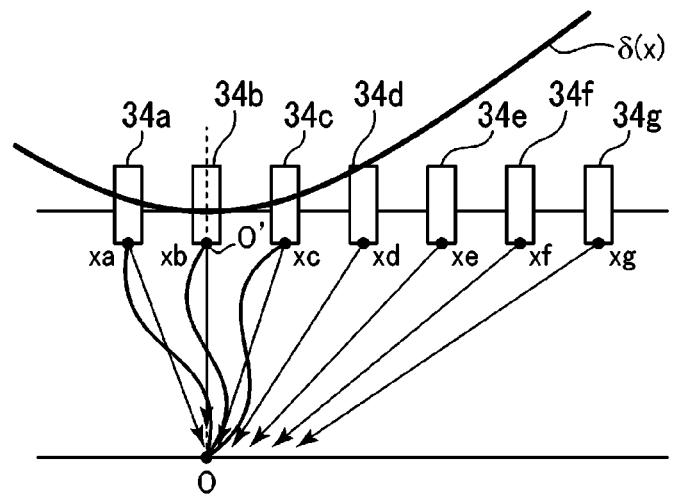
FIG. 11 is a schematic view showing an arrangement of each of the antennas and the phase at the position O.

For example, as shown in FIG. 11, a case is considered in which seven electromagnetic wave radiation parts 34a, 34b, 34c, 34d, 34e, 34f, and 34g are provided, the electromagnetic wave radiation position of the electromagnetic wave radiation part 34b exists at the position O', and the electromagnetic wave radiation positions of the other electromagnetic wave radiation parts are at positions away from the position O'. Note that, in FIG. 11, for the sake of convenience in description, unlike the actual positions, the plurality of electromagnetic wave radiation parts are shown to be arranged transversely.

The x direction positions of the electromagnetic wave radiation positions of the electromagnetic wave radiation parts 34a to 34g are assumed to be xa to xg. Distances between these positions and the position O to be focused are different. Therefore, if electromagnetic waves are radiated in the same phase, phase shift occurs at the position O and electromagnetic wave interference does not occur. Thus, the electromagnetic wave strength cannot be increased. Therefore, the phase θ of the electromagnetic wave radiated from each electromagnetic wave radiation part 34 is shifted by a phase (phase difference) $\delta(x)$ corresponding to the x direction positions of the electromagnetic wave radiation parts 34a to 34g, so that the phases of the electromagnetic waves radiated from the electromagnetic wave radiation parts at the position O are mutually strengthened. As a result, the electromagnetic waves interfere with each other at the position O, so that the electromagnetic waves are strengthened, and the electromagnetic waves are focused at the position O, which makes it is possible to locally increase the electric field strength. FIG. 11 shows that the phases of the electromagnetic waves radiated from the electromagnetic wave radiation parts 34a, 34b, and 34c are mutually strengthened at the position O and a condition in which the electromagnetic waves are strengthened due to the interference is obtained.

However, if a desired electric field strength is obtained by the interference of the electromagnetic waves at the position O, it is not necessary to perform the phase control for strengthening the electromagnetic waves at the focusing position O in all of the electromagnetic wave radiation parts 34a to 34g, such that the phase control may be performed in an appropriate number of two or more electromagnetic wave radiation parts. Further, in the above description, the number of focusing positions in the dielectric window 13 is one, but, without being limited thereto, the phase control may be performed to strengthen the phases at two or more positions on the dielectric window 13 at the same timing.

In addition, it is preferable that a distance from the center of an electromagnetic wave radiation part 34 to the center of an adjacent electromagnetic wave radiation part 34 is smaller than $\lambda/2$, where $\lambda$ is the wavelength of the electromagnetic wave. This is because if the distance (interval) between the adjacent electromagnetic wave radiation parts 34 is larger than $\lambda/2$, it becomes difficult to perform the phase control to strengthen the phases of the electromagnetic waves at the focusing position O on the dielectric window 13.

The electromagnetic wave focusing described above uses the interference of electromagnetic waves by the phase control. Thus, the movement of the focusing portion can be performed at a very high speed without mechanical operation by only the phase control. In principle, the focusing portion can be moved at the same speed as the frequency of the electromagnetic wave. In this way, by moving the focusing position of the electromagnetic wave on the dielectric window 13 at a high speed, the distribution of the electromagnetic waves in the dielectric window 13 can be controlled uniformly, so that plasma can be generated uniformly in the processing space 15 under the dielectric window 13.

Figure 12:
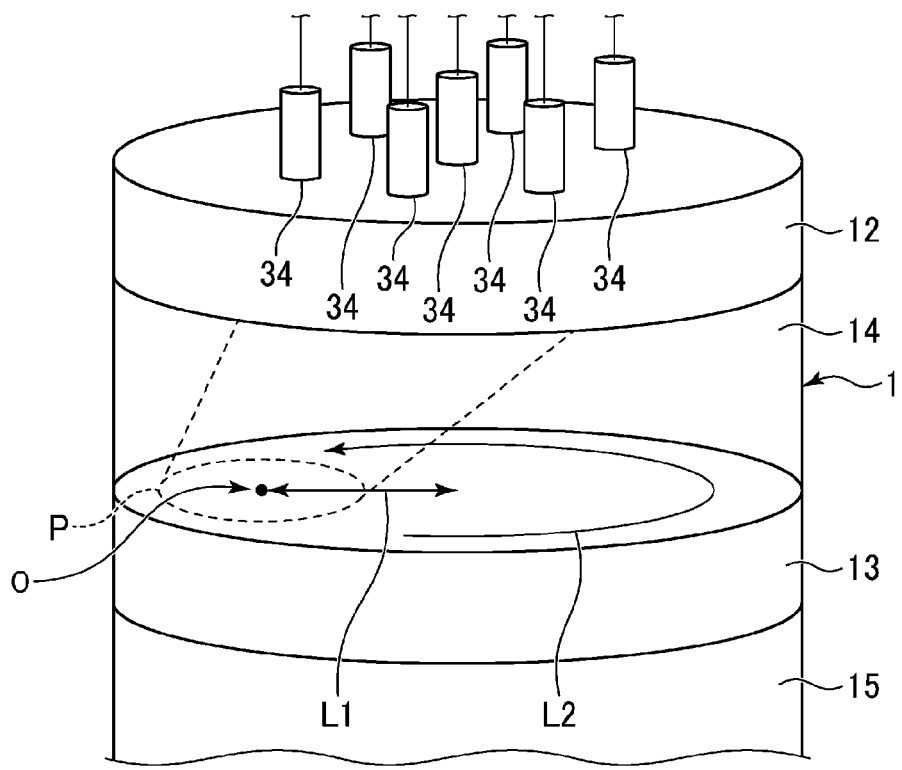
FIG. 12 is a schematic view showing a state in which a focusing portion of a dielectric window is scanned by phase control.

FIG. 12 is a view showing an example of focusing of electromagnetic waves by phase control and scanning of the focusing portion. In the example of FIG. 12, the controller 4 controls the phase shifter 32 (the controller 4 and the phase shifter 32 are not shown in FIG. 12) to strengthen the phases of electromagnetic waves radiated from seven electromagnetic wave radiation parts 34 at the position O. As a result, a focusing portion P is formed in a region centered on the position O, and the electric field of the electromagnetic wave is controlled to be strong in the focusing portion P, as schematically shown in FIG. 12. Then, by the phase control by the phase shifter 32, on the surface of the dielectric window 13, the phases of the electromagnetic waves radiated from the seven electromagnetic wave radiation parts 34 are controlled at a high speed so that the focusing portion P is scanned in a radial direction L1, a circumferential direction L2, and the like. Thus, by scanning the focusing portion P at a high speed, plasma can be uniformly generated in the processing space 15 under the dielectric window 13.

Further, the controller 4 can control the phase shifter 32 to change the movement speed of the focusing portion P by the phase control of the electromagnetic waves radiated from the electromagnetic wave radiation part 34, thereby freely controlling the average electric field distribution per unit time. For example, the phase of the electromagnetic wave is controlled so that the focusing portion P moves at a relatively low speed on the outer peripheral side of the dielectric window 13 and moves at a relatively high speed on the inner peripheral side thereof. As a result, the electric field strength on the outer peripheral side of the dielectric window 13 can be made stronger than the electric field strength on the inner peripheral side thereof, thereby controlling the plasma density on the outer peripheral side under the dielectric window 13 to be higher than the plasma density on the inner peripheral side thereof.

A phased array antenna that forms a focusing portion by phase control and moves the focusing portion has been conventionally known and is used for beam forming in the communication field such as base station-terminal communication and artificial satellite-aegis ship communication. Further, as a technique of using a phased array antenna for plasma processing, there is one disclosed in Japanese Laid-open Publication No. 2017-103454.

However, in this technique, a microwave beam from the phased array antenna is used for adjusting a reaction speed on a semiconductor substrate, but is not used for plasma generation itself as in the present embodiment.

[Effects Obtained by Using Helical Antenna]

The phased array antenna used for beam forming in the communication field such as base station-terminal communication and artificial satellite-aegis ship communication performs beam forming (electromagnetic wave synthesis) in an open space. A monopole antenna having a simple structure is generally used as an electromagnetic wave radiation antenna.

Figure 13:
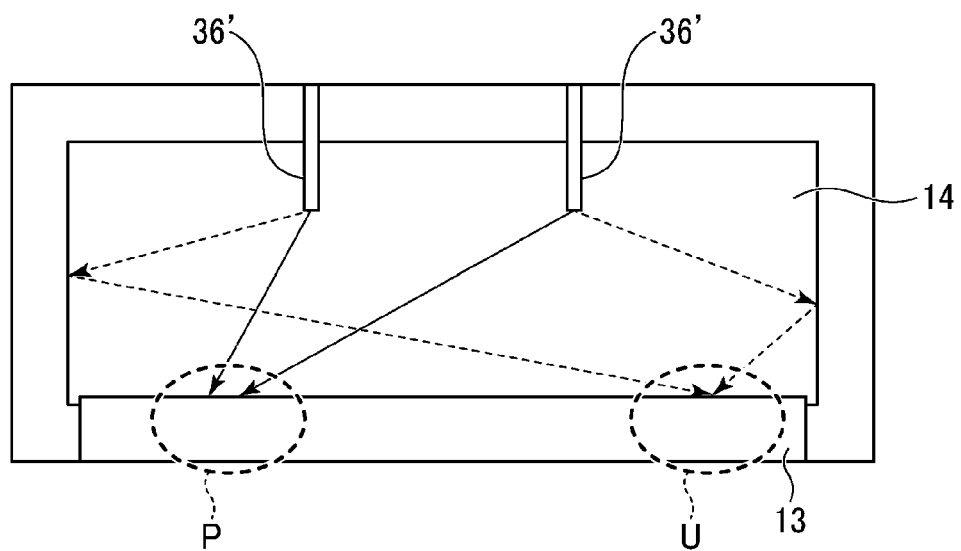
FIG. 13 is a schematic view showing a state in which an electromagnetic wave is reflected on a wall of a synthetic space to form an undesired focusing portion when a monopole antenna is used as an antenna.
Figure 14:
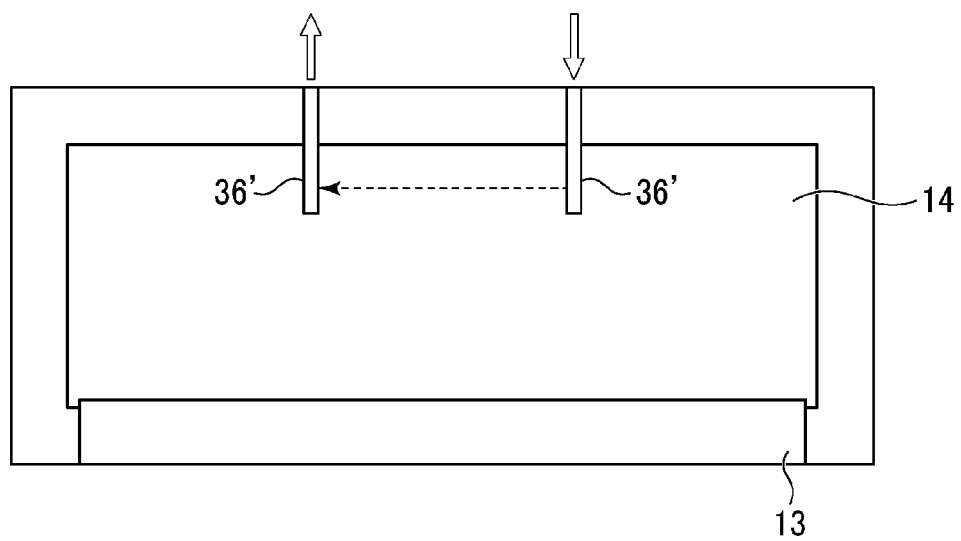
FIG. 14 is a schematic view showing a state in which, when a monopole antenna is used as an antenna, mutual coupling between adjacent antennas increases and some of the power input to an antenna is returned from another antenna.

However, when a phased array antenna is used to generate plasma in the plasma processing apparatus, electromagnetic waves are synthesized in the synthetic space 14, which is a closed space. For this reason, as shown in FIG. 13, if antennas 36' composed of monopole antennas that have a large amount of radiation in the lateral direction are used, electromagnetic waves are reflected on the wall of the synthetic space 14 to form an undesired focusing portion U in addition to a planned focusing portion P of the surface of the dielectric window 13, which makes it difficult to obtain a desired electromagnetic wave distribution. In order to prevent this, it is conceivable to provide the antennas 36' at positions away from the wall, but the apparatus becomes bulky. Further, as shown in FIG. 14, mutual coupling between adjacent antennas 36' becomes large, and some of power input to one antenna is returned from another antenna, which lowers the energy efficiency of plasma generation.

Therefore, in the present embodiment, the antennas 36 of the plurality of electromagnetic wave radiation parts 34 are configured by helical antennas. A helical antenna is a highly directional antenna and can reduce the radiation component of a radiated electromagnetic wave in the lateral direction. Therefore, when arrayed, mutual coupling between antennas is small, so that the energy efficiency of plasma generation can be increased. Further, by using such a helical antenna having high directionality of electromagnetic wave radiation, it becomes easy to control the electromagnetic wave distribution by phase control in the phased array antenna.

In addition, a phased array antenna with better characteristics can be implemented by optimizing the shape and arrangement of the helical antennas. Specifically, as described with reference to FIG. 6, when the number of turns N is set to 1 to 3 and the pitch P is set to a range of $\lambda/12$ to $\lambda/8$, specifically about $\lambda/10$, electromagnetic wave interference can easily occur. Further, when the height H of the synthetic space is set to a range of λ/4 to λ/2 and the height H' from the lower end of the helical antenna to the dielectric window 13 is set to a range of λ/8 to λ/2, it is possible to secure interference of electromagnetic waves while suppressing multiple reflections. Further, when the distance K between the antenna and the sidewall of the synthetic space 14 is set to be λ/10 or more, the influence of reflection on the sidewall can be reduced.

<Electromagnetic Field Simulation Results>

Next, coupling between the antennas was confirmed by electromagnetic field simulation. Here, simulation was conducted on a case where four helical antennas, each of which has two turns, are evenly arranged above a dielectric window, phase control is performed so that the electric field strength at the center of the dielectric window from the four helical antennas is increased, and an electromagnetic wave having a frequency of 860 MHz is radiated. Mutual coupling between the antennas at this time was evaluated with S parameters. The results are shown in Table 1. For the sake of convenience in description, the four helical antennas are denoted by reference numerals A1, A2, A3, and A4.

As shown in Table 1, it was confirmed that, for example, the values of S parameters between the antenna A1 and the antennas A2, A3, and A4 are small, which means that the mutual coupling between the antennas is small.

TABLE 1

|    | A1       | A2       | A3       | A4       |
|----|----------|----------|----------|----------|
| A1 | 0.58592  | 0.090153 | 0.12665  | 0.22488  |
| A2 | 0.090153 | 0.61622  | 0.21523  | 0.081531 |
| A3 | 0.12665  | 0.21523  | 0.55584  | 0.099735 |
| A4 | 0.22488  | 0.081531 | 0.099735 | 0.61986  |

<Other Applications>

The embodiments have been described above. However, it should be noted that the embodiments disclosed herein are exemplary in all respects and are not restrictive. The above-described embodiments may be omitted, replaced or modified in various forms without departing from the scope and spirit of the appended claims.

For example, the configuration of the antenna modules is not limited to those of the above embodiments. For example, the phase shifter may be provided closer to the antenna than the amplifier part, or the phase shifter may be integrated with the amplifier part. Further, the configuration of the electromagnetic wave output part is not limited to the above embodiments.

According to the present disclosure in some embodiments, it is possible to provide a plasma processing apparatus and a plasma processing method capable of freely controlling a plasma distribution regardless of an arrangement of a plurality of electromagnetic wave radiation mechanisms.

What is claimed is:

1. A plasma processing apparatus comprising:
a chamber having a processing space in which a plasma processing is performed on a substrate and a synthetic space in which electromagnetic waves are synthesized;
a dielectric window configured to partition the processing space and the synthetic space;
an antenna unit including a plurality of antennas configured to radiate the electromagnetic waves to the synthetic space and configured to function as a phased array antenna;
an electromagnetic wave output part configured to output the electromagnetic waves to the antenna unit; and
a controller configured to control the antenna unit to function as the phased array antenna,
wherein the plurality of antennas are helical antennas, and
wherein each of the helical antennas has a pitch in a range of λ/12 to λ/8 and a number of turns of 1 to 3, where λ is a wavelength of the electromagnetic waves.

2. The plasma processing apparatus of claim 1, wherein the controller controls a phase of each of the electromagnetic waves radiated from the plurality of antennas so that the electromagnetic waves are focused at an arbitrary position on a surface of the dielectric window by interference to form a focusing portion when the electromagnetic waves are synthesized in the synthetic space.

3. The plasma processing apparatus of claim 2, wherein the controller is configured to control a plasma distribution in the processing space by moving the focusing portion based on the control of the phase.

4. The plasma processing apparatus of claim 3, wherein the controller is configured to control an average electric field distribution per unit time by changing a movement speed of the focusing portion based on the control of the phase.

5. The plasma processing apparatus of claim 4, wherein the antenna unit includes a plurality of phase shifters provided to respectively correspond to the plurality of antennas, and phases of the electromagnetic waves radiated from the plurality of antennas are adjusted by the plurality of phase shifters.

6. The plasma processing apparatus of claim 5, wherein a diameter of each of the helical antennas is $\lambda/\pi$.

7. The plasma processing apparatus of claim 1, wherein each of the plurality of antennas is provided so as to extend vertically from an inner surface of an upper wall of the synthetic space to the synthetic space.

8. The plasma processing apparatus of claim 7, wherein a height of the synthetic space is in a range of λ/4 to λ/2, and a height from a lower end of each of the helical antennas to a surface of the dielectric window is in a range of λ/8 to λ/2.

9. The plasma processing apparatus of claim 1, wherein the antenna unit includes a plurality of phase shifters provided to respectively correspond to the plurality of antennas, and phases of the electromagnetic waves radiated from the plurality of antennas are adjusted by the plurality of phase shifters.

10. The plasma processing apparatus of claim 1, wherein a diameter of each of the helical antennas is $\lambda/\pi$.

11. The plasma processing apparatus of claim 1, wherein each of the plurality of antennas is provided so as to extend vertically from an inner surface of an upper wall of the synthetic space to the synthetic space.

12. A plasma processing method of performing a plasma processing on a substrate with a plasma processing apparatus,
wherein the plasma processing apparatus includes:
a chamber having a processing space in which the plasma processing is performed on the substrate and a synthetic space in which electromagnetic waves are synthesized;
a dielectric window configured to partition the processing space and the synthetic space;
an antenna unit including a plurality of antennas configured to radiate the electromagnetic waves to the synthetic space; and
an electromagnetic wave output part configured to output the electromagnetic waves to the antenna unit, wherein the plurality of antennas are helical antennas, the plasma processing method comprising:

disposing the substrate in the processing space;

controlling a phase of each of the electromagnetic waves radiated from the plurality of antennas so that the antenna unit functions as a phased array antenna;

radiating the electromagnetic waves, the phase of each of which is controlled, from the plurality of antennas to the synthetic space, and focusing the electromagnetic waves at an arbitrary position on a surface of the dielectric window to form a focusing portion; and subsequently, generating plasma in the processing space by the electromagnetic waves that transmit through the dielectric window, and processing the substrate with the plasma, and wherein each of the helical antennas has a pitch in a range of $\lambda/2$ to $\lambda/8$ and a number of turns of 1 to 3, where $\lambda$ is a wavelength of the electromagnetic waves.

13. The plasma processing method of claim 12, further comprising: controlling a distribution of the plasma generated in the processing space by moving the focusing portion by controlling the phase.

14. The plasma processing method of claim 13, further comprising: controlling an average electric field distribution per unit time by changing a movement speed of the focusing portion by controlling the phase.

15. The plasma processing method of claim 12, further comprising: controlling an average electric field distribution per unit time by changing a movement speed of the focusing portion by controlling the phase.

16. The plasma processing apparatus of claim 1, wherein a distance between the helical antennas is equal to or less than $\lambda/2$.

17. The plasma processing method of claim 12, wherein a distance between the helical antennas is equal to or less than $\lambda/2$.

\* \* \* \* \*